Figure 1:
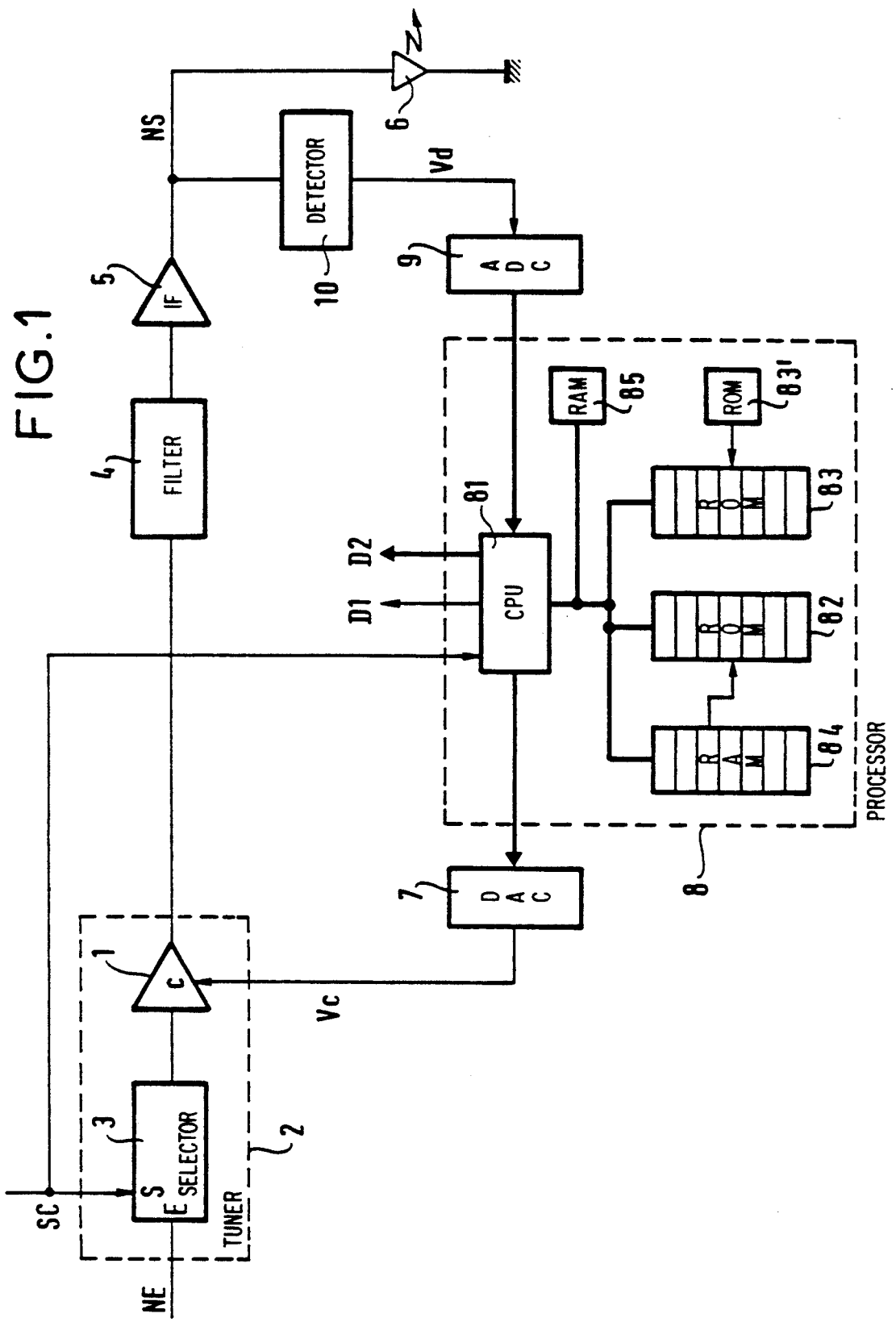

United States Patent [19]

Bureau et al.

[11] Patent Number: 5,194,822
[45] Date of Patent: Mar. 16, 1993

[54] AUTOMATIC GAIN CONTROL METHOD AND DEVICE FOR A VARIABLE GAIN AMPLIFIER AND APPLICATION THEREOF TO CONTROLLING THE GAIN OF A TUNER, IN PARTICULAR FOR A VIDEOCOMMUNICATION NETWORK

[75] Inventors: Christophe Bureau, Bagneux; Stéphane Ruggeri, Magny Les Hameaux, both of France

[73] Assignee: Alcatel Cit, Paris, France

[21] Appl. No.: 744,721

[22] Filed: Aug. 14, 1991

[30] Foreign Application Priority Data

Aug. 14, 1990 [FR] France ................................ 90 10331

[51] Int. Cl.$^5$ ........................... H03G 3/30; H04N 5/52
[52] U.S. Cl. ........................................ 330/129; 330/2; 358/176
[58] Field of Search ................ 330/2, 9, 59, 129, 136, 330/279, 302; 358/174, 176

[56] References Cited
U.S. PATENT DOCUMENTS 4,546,326 10/1985 Van Uffelen et al. ............ 330/129

*Primary Examiner*—Steven Mottola
*Attorney, Agent, or Firm*—Sughrue, Mion, Zinn, Macpeak & Seas

[57] ABSTRACT

The automatic gain control method adapted to maintain the output level equal of the variable gain amplifier to a required value, includes a preliminary calibration phase for establishing a relationship representing the variations in the amplifier gain control signal as a function of variations in the input signal level with a constant output level equal to the required value or as a function of variations in the output signal level for a constant input signal level. The method further includes an operative phase for applying to the amplifier of a particular value of the gain control signal, measuring the corresponding output level, detecting any offset between the result of the measurement and the required value, and if such an offset is detected, determining a corresponding control signal value conditioned by the relationship previously established, and depending on the mode utilized to establish the relationship, either an input level whose offset relative to the corresponding input level given by the relationship at the particular value of the control signal is opposite to said detected offset, or an output level whose offset relative to the required value is opposite to the detected value, and finally, selectively updating the particular value when an offset is detected to so that the particular value becomes equal to the value obtained by the determination.

12 Claims, 3 Drawing Sheets

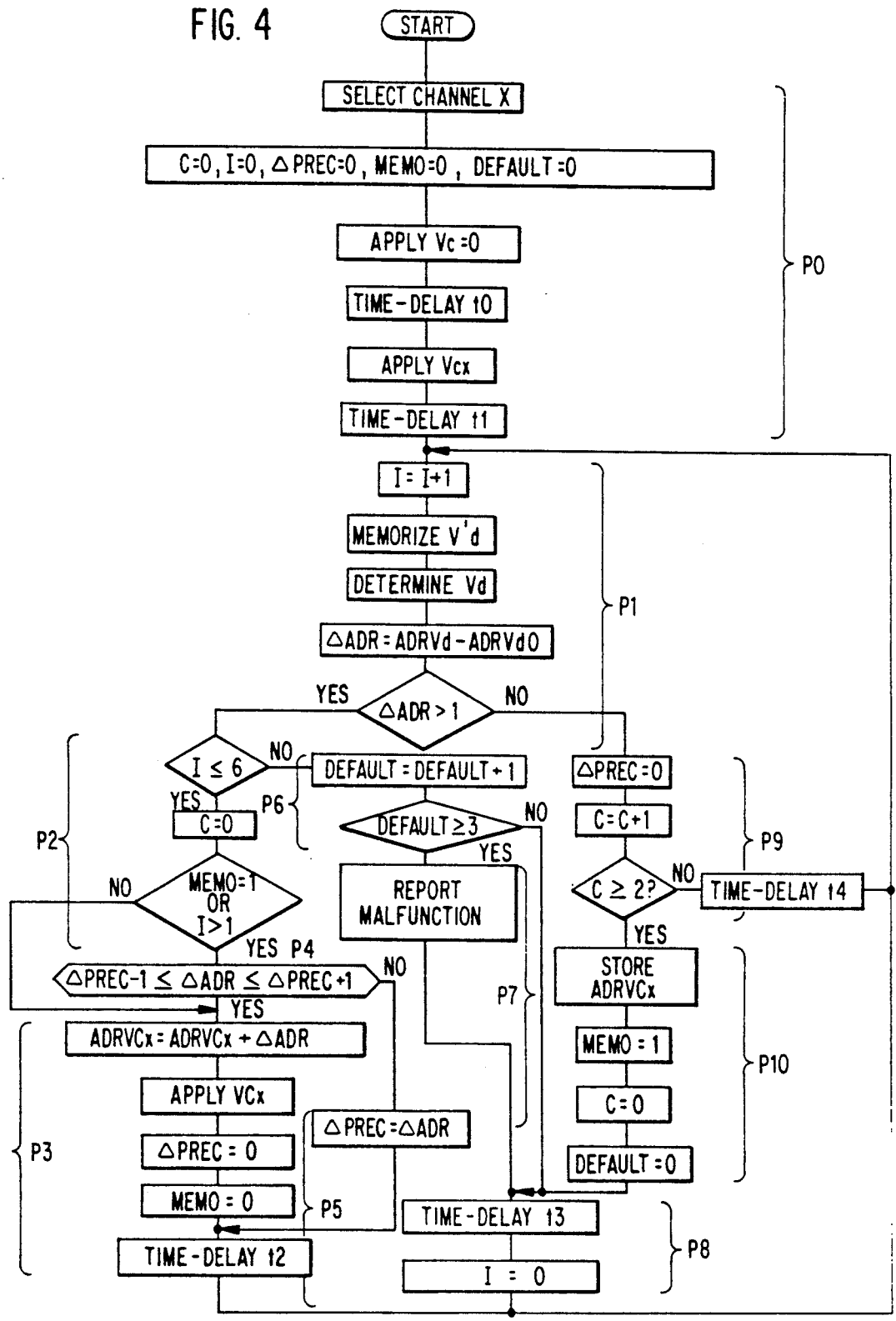

AUTOMATIC GAIN CONTROL METHOD AND DEVICE FOR A VARIABLE GAIN AMPLIFIER AND APPLICATION THEREOF TO CONTROLLING THE GAIN OF A TUNER, IN PARTICULAR FOR A VIDEOCOMMUNICATION NETWORK

The present invention concerns an automatic gain control method and device for a variable gain amplifier intended in particular to maintain the amplifier output signal level at a required value.

The invention is applicable to a videocommunication network, more particularly to so-called distribution equipment of such a network, which receive from a so-called transmission equipment a set of N television signals or channels frequency multiplexed and each transmitted by amplitude modulation of a specific carrier frequency and which transmit various channels selected by respective network subscribers over different optical fibres serving the respective subscribers.

This distribution equipment includes a tuner which selects a channel and transposes the selected channel to an intermediate frequency and which also has an amplifier function.

This amplifier function requires automatic gain control because the level of the carriers of the various channels received at the tuner input varies in time and from one channel to another, variation from one channel to another being possibly caused also by the frequency response of the tuner.

A known way to apply automatic gain control to a variable gain amplifier is to use an analog or digital implementation of a so-called consistent increment method, after application of an initial value of a control signal to the gain control input of the amplifier, to adjust the value of this control signal progressively according to the observed output level, until the required output level is obtained.

A particular drawback of this method is that its convergence time is relatively long, and incompatible with some applications including the application to a videocommunication network as mentioned above, where it is necessary to re-establish the same picture quality virtually instantaneously on the network subscriber's premises, in particular when changing channel.

One object of the present invention is to avoid this drawback.

The present invention consists in an automatic gain control method for a variable gain amplifier adapted to maintain the amplifier output level equal to a required value, characterized in that it includes:

a preliminary calibration phase for establishing a relationship representing the variations in the amplifier gain control signal as a function of variations in the input signal level with a constant output level equal to the required value or as a function of variations in the output signal level for a constant input signal level, an operative phase including the repetition of the following operations:
  application to said amplifier of a particular value of the gain control signal,
  measurement of the corresponding output level,
  detection of any offset between the result of this measurement and the required value,
  if any such offset is detected, determination of a corresponding control signal value conditioned by said relationship and, depending on the mode whereby the latter is established, either an input level whose offset relative to the corresponding input level given by said relationship at said particular value of the control signal is opposite to said detected offset, or to an output level whose offset relative to the required value is opposite to said detected offset,
  selective updating of said particular value, according to whether an offset has been detected or not, so that in the former case it becomes equal to the value obtained by said determination, and in that, said measurement being effected by measurement means that have a non-linear transfer function, said preliminary calibration phase also comprises the establishing of a relationship giving the measured output level variations as a function of the output level variations within a particular range of variation in the latter about the required value and in that, during the operative phase, said output level measurement comprises determination of the measured output level related by said latter relationship to the output level.

Other objects and features of the present invention will emerge from the following description of one embodiment given with reference to the drawings in which:

FIG. 1 shows a block diagram of a device for implementing the method in accordance with the invention in the context of applying this method to a videocommunication network, as explained above, FIGS. 2 and 3 respectively show one example of a law of variation of magnitudes denoted set point voltage and detected voltage, as acquired during the so-called calibration phase of the method in accordance with the invention, FIG. 4 shows a flowchart illustrating the processing carried out during the operative phase of the method in accordance with the invention.

FIG. 1 shows a variable gain amplifier 1 included in a tuner 2 also comprising, on the input side of the amplifier 1, a selector 3 for selecting one of N channels forming a frequency-division multiplexed signal received at an input E of the selector which also has a channel selector input S to which is applied a channel selector signal SC.

In the context of the application to a videocommunication network mentioned above, the number N is equal to 30, for example, and each channel is transmitted by amplitude modulation of a specific carrier, the set of carriers occupying a frequency band from 136 through 360 MHz with an increment of 8 MHz.

The selector 3 also transposes the selected channel to an intermediate frequency which in this application is 38.9 MHz.

In this application the tuner 2 drives a filter 4 which limits the bandwidth of the selected and transposed channel and drives an intermediate frequency amplifier 5 driving a light-emitting diode 6 which provides the signal transmitted by optical fibre to a subscriber of the network.

The variable gain amplifier 1 has a gain control input C to which is applied a set point voltage Vc obtained from a digital-to-analog converter 7 which receives a digital signal from a processor 8.

The processor 8 receives the channel selection signal SC and, via an analog-to-digital converter 9, the output signal of measurement means or a detector 10 which in this example has a non-linear transfer function and which converts the signal applied to its input into a DC voltage Vd representing the level of this signal. In this example the signal applied to the input of the detector 10 is the output signal of the subsystem formed by the tuner 2, the filter 4 and the intermediate frequency amplifier 5, rather than the direct output signal of the tuner, in order to incorporate into the automatic gain control function any drift in the subsystem output level due to the components 4 and 5.

The detector 10 detects the level of the line synchronization signals transmitted during the corresponding synchronization periods of the TV signals, that is to say the unmodulated carrier transmitted during these periods, and has sufficient speed and memory capacity to achieve such detection, these synchronization periods being very short, in the order of 10 microseconds, and recurring at a period of up to a few tens of milliseconds depending on the code employed (D2MAC, SECAM, etc).

The processor 8 comprises a central processor unit 81 associated with read-only memories 82, 83, 83' and random access memories 84, 85, the read-only memories 82 and 83 being respectively called the set point voltage memory and the detected voltage memory and respectively containing a set point voltage table and a detected voltage table produced during a previous calibration phase.

In the present application, automatic control of the gain of the amplifier 1 is directed to maintaining the output level $N_S$ of the subsystem to a required value $N_{SO}$ equal to $-3$ dBm, for example, irrespective of which channel is selected and of any variations with time of the level $N_E$ of the signal on the channel at the tuner input, the signal level at the subsystem input varying in a range of $\pm 4$ dB around a nominal value $N_{EO}$ equal to $-37$ dBm, for example.

The set point voltage table is obtained in this example by varying the input level $N_E$ in steps of "n" dB within the range of variations in question and by noting each time the value of the set point voltage Vc which must be applied to the gain control input C of the amplifier 1 to maintain the output level $N_S$ for any selected channel [untranslatable garbled text—Tr.]. The value "n" may be equal to 0.5, for example.

The set point voltage table could equally well be obtained by applying a constant input level $N_E$ and noting the various values of the set point voltage Vc, within its range of variation, which when applied to the control input C of the amplifier 1 produce an output level $N_S$ [untranslatable garbled text—Tr.].

The detected voltage table is in this example obtained by noting the various detected voltage Vd obtained at the output of the detector 10 for various detector input levels varying by steps of "n" dB in the range of variation of the output level $N_S$.

These variations in the detector input level may be obtained either by varying the input level $N_E$ with constant set point voltage Vc or by varying the set point voltage Vc with a constant input level $N_E$.

To simplify this, a tuner input signal in the form of a continuous sinusoid at a frequency equal to the carrier frequency of a selected channel may be used during this calibration phase.

The calibration phase advantageously includes adjustment of the gain of the subsystem formed by the tuner 2, the filter 4 and the intermediate frequency amplifier 5, in this example adjustment of the gain of the intermediate frequency amplifier 5, so as to match the dynamic range of the input signal of this subsystem to the dynamic range of variation in the gain of the variable gain amplifier 1.

In this example, this matching is such as to obtain the required value $N_{SO}$ at the output of this subsystem for a maximal set point voltage (10 Volts, for example) and for the worst case input conditions, that is a selected channel representing maximal attenuation due to the amplitude/frequency response of the tuner and a signal level for this channel at the subsystem input equal to the minimal value $N_{Em}$ (in this example, 4 dB down relative to the nominal value $N_{Eo}$).

After this initial, open-loop adjustment, the set point voltage and detected voltage tables are obtained as explained above, also under open loop conditions.

The various values of the set point voltage obtained in this example for an input level increasing in steps of 0.5 dB and converted into digital form are stored at successive addresses in the set point voltage memory 82, each address being defined by adding to the previous address a fixed addressing increment "p" with a decimal value equal to 1, for example.

The set point voltage memory 82 is associated with a pointer, in this example one of the memory locations of the random access memory 84, which is called the pointer memory, and indicating as symbolically represented by an arrow in FIG. 1 which of the addresses in the set point voltage memory 82 contains the current value of set point voltage to be applied, during the operative (closed-loop) phase, to the gain control input of the amplifier 1 to obtain the required output voltage $N_{SO}$.

Each memory location of the pointer memory 84 is associated with a specific channel and indicates the address in the set point voltage memory 82 containing the set point voltage value to be applied under closed loop conditions to the amplifier 1 to obtain the required output value $N_{SO}$ for the channel in question.

The content of the pointer memory 84 is updated continuously during the operative phase as will be explained later and its initial content is advantageously determined, when the operative phase is initialized, by closed loop implementation of the processing algorithm characteristic of the operative phase, to be described subsequently, starting with any content of the pointer memory 84.

Likewise, the detected voltage values Vd obtained for a detector input level increasing in this example in steps of 0.5 dB and converted into digital form are stored at successive addresses in the detected voltage memory 83, each address being defined by adding to the previous address a fixed addressing increment "p" equal to that chosen for the set point voltage memory 82, with a decimal value equal to 1, for example.

The detected voltage memory 83 is also associated with a pointer formed by a register 83, and indicating, as symbolically shown by an arrow in FIG. 1, the address ADR $Vd_o$ which represents a detected voltage $Vd_o$ itself representing an output level $N_S$ of this subsystem equal to the required value $N_{SO}$.

The law of variation in the detected voltage Vd as a function of the subsystem output level and the law of variation in the set point voltage Vc as a function of the tuner input level are therefore established in discrete form and stored in the read-only memories 82 and 83. If either law or both laws were expressed in a mathematical form lending themselves to computation by a microprocessor the corresponding memory or memories could be dispensed with and the corresponding mathematical expression or expressions calculated directly by the central processor unit 81.

Figure 2:
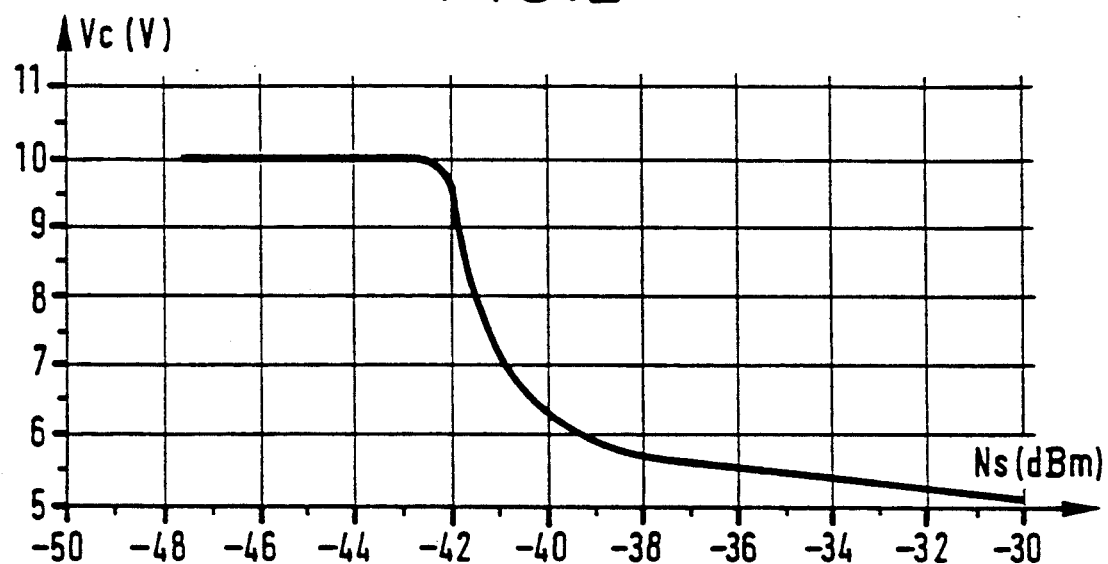
Figure 3:
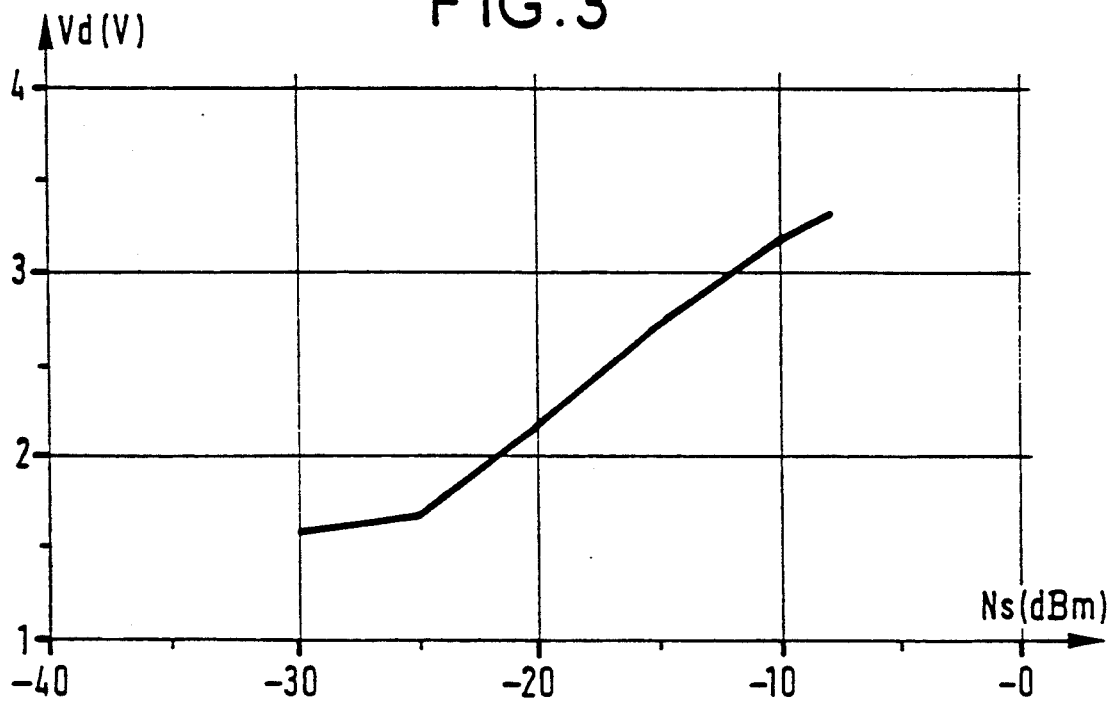

Typical curves illustrating these laws of variation are shown by way of example in FIGS. 2 and 3.

As the set point voltage variation law may vary from one tuner to another it may be necessary to determine the table or the corresponding mathematical function for each tuner. The same applies to the detected voltage variation law, which may vary from one detector to another.

There will now be described with reference to the FIG. 4 flowchart the processing carried out by the central processor unit 81 during the operative (closed-loop) phase for each selected channel.

After selecting the channel "x" concerned, an initialization stage Po is executed, comprising:

initialization to 0 of variables C, I, $\Delta$PREC, MEMO and DEFAULT, the utility of which will be explained later, application to the digital-to-analog converter 7 (FIG. 1) of a null value set point voltage commanding the application of a null value gain during a brief period $t_0$ in the order of 200 ms, for example, to stabilize the tuner when the channel is changed, application to the digital-to-analog converter 7 (FIG. 1) of the set point value Vcx read off from the set point voltage memory 82 at the address indicated by the pointer memory 84 for the channel "x" concerned, triggering of a time-delay $t_1$ in the order of 500 ms for example, for stabilization of the tuner after application of this set point voltage.

Except for any change in the level for this channel since it was last selected, or since the pointer table was established in the case of the first selection, the set point voltage Vcx applied in this way produces the required output value $N_{SO}$.

A processing stage Pl for detecting the presence or the absence of any such change is then executed, comprising:

incrementing the variable I by one unit, temporary storage, for the duration of this stage, in the random access memory 85 (FIG. 1), called the working memory, of the value V'd available at the output of the analog-to-digital converter 9 (FIG. 1), which is preferably a mean value over a number of consecutive digital samples of the output level of this converter, in order to avoid acting on isolated spurious signals at the subsystem output, looking up the detected voltage Vd stored in the detected voltage memory closest to this value V'd and determination of the offset $\Delta$ADR between the corresponding address ADRVd and the reference address ADRVdo corresponding to the nominal value Vdo, that is to say the required value $N_{SO}$, comparing the absolute value $|\Delta\text{ADR}|$ of this address offset with the address increment "p", equal to 1 in this example.

If the absolute value of the address offset is greater than 1, in other words if a (meaningful) offset has been detected representing a change of the channel "x" as mentioned above, and assuming that the variable I equals 1, the value of the variable I being verified by a test To during a processing stage P2 then executed, a new value of the set point voltage Vc is determined during a subsequent processing stage P3 comprising:

calculating the address DRVCx of the new set point voltage by adding to the address ADRVCx of the current set point voltage, supplied by the pointer memory 84, the offset $\Delta$ADR determined in this way, applying this new set point voltage value Vcx to the digital-to-analog converter 7, triggering a time-delay t2 of 300 ms, for example, for stabilization of the tuner, rerurn or processing stage P1.

If after this further processing stage P1 is executed the absolute value of the address offset is again greater than 1, and this time assuming the value I equals 2, also verified by the test To during the subsequent processing stage P2, a processing stage P5 is executed, comprising:

setting the variable $\Delta$PREC to the current value $\Delta$ADR, in order to memorize this value $\Delta$ADR for subsequent values of I for which the absolute value of the address offset would again be detected greater than 1, triggering a time-delay $t_2$ of 300 ms, for example, returning to processing stage P1, in this example for a value of I equal to 3.

If after this further processing stage P1 is executed the absolute value of the address offset is again greater than 1, and this time assuming the value I equals 3, verified by the test To during the processing stage P2, a processing stage P4 is then executed, consisting in a test for comparing, with a resolution of one unit (greater than or less than) to allow for any defects of accuracy, the address offset obtained in this way with that $\Delta$PREC obtained for the preceding value of I, in this example the value 2, in which case, if identity (to within one unit) is observed, the processing stage P3 is again executed, whereas if non-identity (to within one unit) is observed, the processing stage P5 is again executed.

The test carried out during phase P4 avoids immediate correction of the set point voltage when the change noted may be due to the presence of spurious signals or to the fact that the subsystem as a whole is not yet fully stabilized following a first correction of the set point voltage, given the speed with which the measures require to be repeated.

The processing stage P4 test may also be used, as shown in the algorithm represented in FIG. 4, as a condition for passing to the stage P5 for the value I equals 2 because, the variable $\Delta$PREC having been initialized to 0 in the initial processing stage P0, this test then leads automatically to stage P5 (the absolute value of the address offset being assumed in this instance to be greater than 1).

If the absolute value of the address offset were to be detected as greater than 1 during six successive processing stages P1 in which any of the stages P2, P3, P4, P5 were executed in the manner described above, a test T1 carried out during stage P2 branches to a processing stage P6 comprising counting of three successive cycles of six such successive stages, by incrementing the variables DEFAULT by one unit for each cycle of six stages, and then comparing this variable with the value 3.

If the variable is greater than or equal to 3, a processing stage P7 is executed, comprising reporting of this state, then a processing stage P8 comprising a return to the processing stage P1 after triggering of a time-delay t3, for example, and reinitialization of the variable I to 0.

Otherwise, in other words if the variable DEFAULT is less than 3, the processing stage P8 would be executed directly.

The reporting mentioned above may comprise transmission by the central processor unit 81 of a binary signal D1 (FIG. 1) whose value goes to 1, for example, when the variable DEFAULT becomes equal to 3.

However, this reporting advantageously comprises transmission of a digital signal D2 (FIG. 1) representative of the applicable address offset ΔADR or simultaneous transmission of the signals D1 and D2, which is the situation shown in FIG. 1.

The detection of a signal D1 of value 1 in this example normally interrupts operation of the subsystem. In practice, as the value 1 of the signal D1 can be obtained for various values of the offset ΔADR, previous comparison of the value of the signal D2 representing the offset ΔADR in question with a limiting value makes it possible to interrupt such operation only if the offset ΔADR reaches the limiting value.

These various reporting modes are combined under the generic name of malfunction reporting.

If the absolute value of the address offset ΔADR is found to be less than or equal to 1, that is to say if no (meaningful) offset is detected, following execution of a processing stage P1 a processing stage P9 is executed, comprising a test on such detection on two successive processing stages P1, by incrementing the variable C by one unit on each branch to this processing stage P9 and then comparison of this variable with the value 2.

If such detection results on two successive processing stages P1, the address ADRCVx of the current set point voltage value Vcx is stored in the pointer memory 84 at the address thereof for the channel "x" in question, during a processing stage P10 which then comprises a return to the stage P1 via the stage P8.

To report this new record, the variable MEMO is set to 1 during the processing stage P10 and the condition described above, defining the test To carried out during the stage P2 for branching either to the stage P3 or the stage P4 depending on the value of I, is complemented by a second condition, in respect of the variable MEMO, such that the stage P2 is followed directly by the stage P3 only if the variable MEMO has the value 0 and the variable I has the value 1, being otherwise followed by the stage P4. The variable MEMO is reinitialized to 0 each time a new set point value is computed during stage P3.

If such detection occurs on two successive processing stages P1, a time-delay t4 in the order of 300 ms is triggered prior to returning to stage P1.

To enable the test carried out during the processing stage P9 to give a positive result and therefore to lead to the processing stage P10 only for two successive processing stages P1 each yielding an offset |ΔADR| less than or equal to 1, the variable C is reinitialized to 0 during the processing stages P2 and P10.

To enable the test carried out during the processing stage P4 to give a positive result and therefore to lead to the processing stage P3 which includes the application of a new set point voltage value to the converter 7, only in respect of two consecutive processing stages P1 carried out for the same applied set point value which have yielded two offsets |ΔADR| greater than 1 and identical to each other (to within one unit), the processing stages P3 and P9 also include reinitialization to 0 of the variable ΔPREC.

The variable DEFAULT is reinitialized to 0 during the processing stage P10 because, the output level having then become correct again, there is no reason for any other value of the variable DEFAULT.

Note that any selection of a new channel during execution of the algorithm described above is regarded as taking priority and therefore leads to the initialization stage P0.

As just described, the method in accordance with the invention makes it possible to apply automatically the set point voltage value needed to obtain immediately the required value at the output of the processing subsystem, if the latter has not changed.

Should any offset be detected relative to this required value, the method in accordance with the invention also makes it possible to determine automatically the set point voltage value to apply to compensate for the offset immediately, whereby the convergence time is reduced as compared with the so-called increment method.

The method in accordance with the invention also makes it possible to detect when it is impossible to apply such compensation, reflecting a malfunction that should be reported.

We claim:

1. Automatic gain control method for a variable gain amplifier adapted to maintain the amplifier output level equal to a required value, comprising the steps of:

establishing a relationship in a preliminary calibration phase representing variations in an amplifier gain control signal as a function of variations in input signal levels with a constant output signal level equal to the required value or as a function of variations in output signal levels for a constant input signal level, performing an operative phase by repeating the following operations:

applying a particular value of the gain control signal to said amplifier, measuring a corresponding output level, detecting any offset between a result of measuring the corresponding output level and the required value, determining a corresponding control signal value conditioned by said relationship if any offset is detected and, depending on the mode whereby the relationship is established, either an input level whose offset relative to the corresponding input signal levels given by said relationship at said particular value of the control signal is opposite to said detected offset, or an output level whose offset relative to the required value is opposite to said detected offset, selectively updating said particular value, according to whether an offset has been detected or not, so that when an offset has been detected, the particular value becomes equal to a value obtained by said determining of said corresponding control signal value, and said measuring being effected by measurement means that have a non-linear transfer function, said preliminary calibration phase also comprising a step of establishing another relationship representing measured output level variations as a function of the variations of the output signal levels within a predetermined range of variation in the output signal levels about the required value and in that, during the operative phase, said measuring of a corresponding output level comprises determination of measured output level related by said another relationship to the output level].

2. The method according to claim 1 characterized in that the preliminary calibration phase further comprises matching of a dynamic range of the variable gain amplifier gain control signal either to the dynamic range of an input signal or to the dynamic range of an output signal, according to the mode whereby said relationship is established.

3. The method according to claim 1 or claim 2 characterized in that said determined, selectively updated value is memorized.

4. The method according to claim 3 characterized in that said determined value of the control signal for each of a plurality of channels represented by said input signal levels which vary independently of one another is memorized for initial application on each change of channel during the operative phase.

5. The method according to claim 4 characterized in that said determining and selectively updating operations are carried out after a detecting operation only if an offset substantially equal to that detected during a previous detecting operation is detected, carried out for said particular value, a new measuring operation and a dew detecting operation with said particular value being repeated otherwise.

6. The method according to claim 4 characterized in that in selectively updating, said memorization is effected only after several consecutive detecting operations indicating an absence of any offset for said determined updated value.

7. The method according to claim 6 characterized in that malfunction reporting is performed at the end of a particular number of consecutive detecting operations detecting an offset.

8. A device for automatic gain control of a variable gain amplifier to maintain a required value comprising:
a detecting means (10) for measuring a level of an output signal from said variable gain amplifier,
an analog-to-digital converter (9) which receives a signal from said detecting means,
a processor (8) for receiving an output from said analog-to-digital converter (9), and
a digital-to-analog converter (7) for receiving an output from said processor (8) and for outputting a gain control signal to a gain control input (C) of said variable gain amplifier,
said processor (8) providing a first memory means for storing a relationship representing variations of the gain control signal and a particular value of the control signal,
said processor (8) further comprising second memory means for storing another relationship representing variations in measured output levels and the required value of the measured output.

9. A device for automatic gain control of a variable gain amplifier to maintain a required value comprising:
a detecting means (10) for measuring a level of an output signal from said variable gain amplifier,
an analog-to-digital converter (9) which receives a signal from said detecting means,
a processor (8) for receiving an output from said analog-to-digital converter (9), and
a digital-to-analog converter (7) for receiving an output from said processor (8) and for outputting a gain control signal to a gain control input (C) of said variable gain amplifier,
said processor (8) providing a first memory means for storing a relationship representing variations of the gain control signal and a particular value of the control signal,
wherein said processor further comprises first pointer means (84) indicating an address of said first memory means containing said particular value of the control signal.

10. The device according to claim 8 wherein said processor further comprises second pointer means (83') for indicating an address in said second memory means containing said required value.

11. The device according to claim 10 characterized in that said offset between measured output and the required value is in the form of offset between the address provided by said second pointer means (83') and the address corresponding to the discrete value memorized in said first memory means (83) nearest the result of said measured output.

12. The device according to claims 8, 9, 10 or 11, wherein said automatic control device is applied to a videocommunication network where a tuner receives at its input a multiplex of N television signals each transmitted by amplitude modulation of a carrier of a particular frequency and of level varying in time and from one channel to another.

* * * * *